(12) United States Patent
Kawai et al.

(10) Patent No.: US 7,479,412 B2
(45) Date of Patent: Jan. 20, 2009

(54) ADHESIVE FILM FOR SEMICONDUCTOR, LEAD FRAME AND SEMICONDUCTOR DEVICE USING THE SAME, AND METHOD OF PRODUCING SEMICONDUCTOR DEVICE

(75) Inventors: Toshiyasu Kawai, Ichihara (JP); Hidekazu Matsuura, Ichihara (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 12/099,238

(22) Filed: Apr. 8, 2008

(65) Prior Publication Data

US 2008/0194062 A1  Aug. 14, 2008

Related U.S. Application Data

(62) Division of application No. 11/347,204, filed on Feb. 6, 2006, now Pat. No. 7,378,722, which is a division of application No. 10/734,124, filed on Dec. 15, 2003, now Pat. No. 7,057,266, which is a division of application No. 10/111,231, filed as application No. PCT/JP00/07826 on Nov. 8, 2000.

(30) Foreign Application Priority Data

Nov. 10, 1999  (JP)  .............................. 1999-320301

(51) Int. Cl.
*H01L 21/00* (2006.01)
(52) U.S. Cl. .................. 438/124; 438/123; 438/118; 257/E21.51; 257/E21.502; 257/E21.513
(58) Field of Classification Search .................. 438/124
See application file for complete search history.

(56) References Cited

U.S. PATENT DOCUMENTS 5,200,362 A   4/1993   Lin et al.

(Continued)

FOREIGN PATENT DOCUMENTS

JP           03-094460          4/1991

(Continued)

OTHER PUBLICATIONS

Office Action dated Apr. 20, 2004, for Korean Application No. 10-2002-0035194 and the Divisional Application No. 10-2002-7005557.

(Continued)

*Primary Examiner*—David A Zarneke
(74) *Attorney, Agent, or Firm*—Antonelli, Terry, Stout & Kraus, LLP.

(57) ABSTRACT

An adhesive film for semiconductor, which comprises at least one resin layer, and, after bonded to a lead frame, has at 25° C. a 90°-peel strength of at least 5 N/m between the resin layer and the lead frame, and, after a lead frame is bonded to the adhesive film for semiconductor and sealed with a sealing material, has at least at one point of temperatures ranging from 0 to 250° C. a 90°-peel strength of at most 1000 N/m between the resin layer and each of the lead frame and the sealing material; a lead frame and a semiconductor device using the adhesive film for semiconductor; and a method of producing a semiconductor device.

13 Claims, 2 Drawing Sheets

U.S. PATENT DOCUMENTS

| | | |
|---|---|---|
| 5,273,938 A | 12/1993 | Lin et al. |
| 5,665,473 A | 9/1997 | Okoshi et al. |
| 5,673,123 A | 9/1997 | Dickinson |
| 5,729,049 A | 3/1998 | Corisis et al. |
| 5,844,315 A | 12/1998 | Melton et al. |
| 5,894,108 A | 4/1999 | Mostafazadeh et al. |
| 5,922,167 A | 7/1999 | Rosenfeld |
| 5,932,345 A | 8/1999 | Furutani et al. |
| 5,977,615 A | 11/1999 | Yamaguchi et al. |
| 6,001,671 A | 12/1999 | Fjelstad |
| 6,117,710 A | 9/2000 | Mostafazadeh et al. |
| 6,291,274 B1 | 9/2001 | Oida et al. |
| 6,348,729 B1 | 2/2002 | Li et al. |
| 6,429,047 B1 | 8/2002 | Huang |
| 6,523,446 B1 | 2/2003 | Tanabe et al. |
| 6,534,849 B1 | 3/2003 | Gang |
| 6,558,500 B2 | 5/2003 | Matsuura et al. |
| 6,558,791 B2 | 5/2003 | Matsuura et al. |
| 6,596,677 B1 | 7/2003 | Machac et al. |
| 6,646,339 B1 | 11/2003 | Ku et al. |
| 6,717,248 B2 | 4/2004 | Shin et al. |
| 6,733,880 B2 | 5/2004 | Tanabe et al. |
| 6,744,133 B2 | 6/2004 | Tanabe et al. |
| 7,095,054 B2 | 8/2006 | Fjelstad |
| 2004/0038451 A1 | 2/2004 | Hawks et al. |
| 2005/0255278 A1 | 11/2005 | Matsuura et al. |

FOREIGN PATENT DOCUMENTS

| | | |
|---|---|---|
| JP | 5-129473 | 5/1993 |
| JP | 08-157599 | 6/1996 |
| JP | 2547823 | 8/1996 |
| JP | 10-12773 | 1/1998 |
| JP | 10-056122 | 2/1998 |
| JP | 10-56122 | 2/1998 |
| JP | 10-077353 | 3/1998 |
| JP | 11-246685 | 9/1999 |
| JP | 11-251504 | 9/1999 |
| JP | 11-291391 | 10/1999 |
| WO | WO 98/15975 | 4/1998 |
| WO | WO 99/04432 | 1/1999 |

OTHER PUBLICATIONS

Chinese Official Action dated Jul. 28, 2006.

US 7,479,412 B2

ADHESIVE FILM FOR SEMICONDUCTOR, LEAD FRAME AND SEMICONDUCTOR DEVICE USING THE SAME, AND METHOD OF PRODUCING SEMICONDUCTOR DEVICE

This application is a Divisional application of application Ser. No. 11/347,204, filed Feb. 6, 2006 now U.S. Pat. No. 7,378,722, which is a Divisional application of application Ser. No. 10/734,124, filed Dec. 15, 2003 now U.S. Pat. No. 7,057,266, which is a Divisional application of application Ser. No. 10/111,231, filed Apr. 23, 2002, the contents of which are incorporated herein by reference in their entirety. Ser. No. 10/111,231 is a National Stage application filed under 35 USC 371 of International (PCT) Application No. PCT/JP00/07826, filed Nov. 8, 2000.

TECHNICAL FIELD

The present invention relates to an adhesive film for semiconductor, a lead frame and a semiconductor device using the adhesive film for semiconductor, which adhesive film can be easily peeled off from lead frames and sealing resins, contributing to high working efficiency in the production of packaged semiconductor devices. The present invention also relates to a method of producing a semiconductor device.

BACKGROUND ART

Conventional packaged semiconductor devices have been produced by bonding a semiconductor element to a die pad of a lead frame with an adhesive such as a silver paste, connecting it with the lead frame by wire-bonding and then sealing the whole body except outer leads for external connection. However, with a recent demand for packaged semiconductor devices of higher density and smaller area and thickness, packages of various structures have been developed. Some examples are LOC (lead on chip) and COL (chip on lead), but are not decreased enough in area and thickness.

Another approach developed to solve these problems is a package structure wherein only one side of packages (the side bearing semiconductor elements) is sealed to use the exposed backside of lead frames for external connection. Packages of this structure achieve the decrease in area and thickness because lead frames do not protrude from sealing resin, but the sealing resin tends to creep even on the backside of lead frames.

The inventors have found that such a trouble might be prevented by protecting the backside of lead frames by bonding an adhesive film and peeling it off after sealing. This method needs an adhesive film which has enough bonding strength to lead frames and, after resin sealing, can be peeled off easily with heat or the like. However, there has been no adhesive film for semiconductor that possesses both the antipodal properties.

DISCLOSURE OF INVENTION

An object of the present invention is to provide an adhesive film for semiconductor and a lead frame and a semiconductor device using the same, which adhesive film not only has enough bonding strength to lead frames and, after resin sealing, can be easily peeled off, but also possesses other characteristics necessary in semiconductor applications.

Another object of the invention is to provide a method of producing semiconductor device whereby semiconductor devices of high density and small area and thickness can be produced efficiently.

Accordingly, the present invention relates to an adhesive film for semiconductor, which comprises at least one resin layer A, and, after bonded to a lead frame, has at 25° C. a 90°-peel strength of at least 5 N/m between the resin layer A and the lead frame, and, after a lead frame is bonded to the adhesive film for semiconductor and sealed with a sealing material, has at least at one point of temperatures ranging from 0 to 250° C. a 90°-peel strength of at most 1000 N/m between the resin layer A and each of the lead frame and the sealing material.

According to the present invention, after the sealing with the sealing material, the adhesive film for semiconductor preferably has at a temperature ranging from 100 to 250° C. a 90°-peel strength of at most 1000 N/m between the resin layer A and each of the lead frame and the sealing material.

According to the present invention, it is preferable that the adhesive film for semiconductor has a 90°-peel strength of at most 1000 N/m between the resin layer A and each of a lead frame and a sealing material at a temperature at which the adhesive film for semiconductor is peeled off from the lead frame and the sealing material after sealing with the sealing material.

According to the present invention, the resin layer A preferably has a glass transition temperature of 100 to 300° C. Further, the resin layer A preferably loses weight by 5% by weight at a temperature of 300° C. or higher.

According to the present invention, the resin layer A preferably has an elastic modulus of at least 1 MPa at 230° C. Further, the resin layer A preferably comprises a thermoplastic resin having an amide group, an ester group, an imide group, an ether group or a sulfone group, particularly preferably an amide group, an ester group, an imide group or an ether group.

The adhesive film for semiconductor of the present invention preferably has a support film with one or each side coated with the resin layer A.

According to the present invention, the support film is preferably made of a material selected from the group consisting of aromatic polyimide, aromatic polyamide, aromatic polyamideimide, aromatic polysulfone, aromatic polyether sulfone, polyphenylene sulfide, aromatic polyether ketone, polyallylate, aromatic polyether ether ketone and polyethylene naphthalate.

The adhesive film for semiconductor of the present invention preferably has a ratio of a thickness (A) of the resin layer A to a thickness (B) of the support film, (A/B), of at most 0.5.

According to the present invention, it is preferable that one side of the support film is coated with the resin layer A having adhesiveness, and the other side is coated with a resin layer B having no adhesiveness which has an elastic modulus of at least 10 MPa at 230° C.

The present invention further relates to a lead frame to which the adhesive film for semiconductor of the present invention is bonded.

The lead frame of the present invention is preferably bonded to the adhesive film for semiconductor, with one side of the lead frame contacting the resin layer A.

The present invention further relates to an adhesive film-bearing semiconductor device using the adhesive film for semiconductor of the present invention.

The adhesive film-bearing semiconductor device of the present invention preferably comprises
 the adhesive film for semiconductor,
 a lead frame bonded to the adhesive film for semiconductor with one side of the lead frame contacting the resin layer A,
 a semiconductor element bonded to a die pad on another side of the lead frame, a wire connecting the semiconductor element and an inner lead of the lead frame, and a sealing material which seals the semiconductor element and the wire.

The present invention further relates to a semiconductor device produced by peeling off the adhesive film for semiconductor from the adhesive film-bearing semiconductor device described above.

The present invention further relates to a method of producing a semiconductor device, comprising a step of bonding an adhesive film for semiconductor to a side of a lead frame having inner leads and a die pad, a step of bonding a semiconductor element to the die pad on the other exposed side of the lead frame, a step of connecting the semiconductor element to the inner leads with wires by wire-bonding, a step of sealing the exposed side of the lead frame, the semiconductor element and the wires with a sealing material, and a step of peeling off the adhesive film for semiconductor from the lead frame and the sealing material.

In the case where the lead frame used in the above method comprises a plurality of patterns each of which comprises a die pad and inner leads, the lead frame is optionally divided into a plurality of semiconductor devices each of which contains one semiconductor element.

In the method described above, the adhesive film for semiconductor is preferably the adhesive film for semiconductor of the present invention, and the adhesive film for semiconductor is bonded to the lead frame, with the resin layer A contacting the lead frame.

BEST MODE FOR CARRYING OUT THE INVENTION

Figure 1:
FIG. 1 is a sectional view of an adhesive film for semiconductor of an embodiment according to the present invention.

Hereinafter described in detail are the embodiments of the adhesive film for semiconductor according to the present invention, the lead frame and the semiconductor device using it, and the method of producing a semiconductor device according to the present invention.

Adhesive Film for Semiconductor

For example, the adhesive film for semiconductor of the present invention is suitably used in the production of semiconductor devices. In the case where the adhesive film for semiconductor of the present invention is used to produce semiconductor devices, the production of semiconductor devices preferably comprises the following steps:

(1) a step of bonding the adhesive film for semiconductor of the present invention to a lead frame at 150 to 400° C.; (2) a step of bonding a semiconductor element to a die pad of the lead frame with an adhesive such as a silver paste, and then curing the adhesive by heating for 30 minutes to 2 hours at 140 to 200° C.; (3) a step of wire-bonding with gold wire or the like to connect inner leads of the lead frame with the semiconductor element by heating at 200 to 270° C. for 3 to 30 minutes; (4) a step of sealing with a sealing material at 150 to 200° C.; (5) a step of curing the sealing material by heating for 4 to 6 hours at 150 to 200° C. and (6) a step of peeling off the adhesive film for semiconductor from the lead frame and the sealing material at 0 to 250° C. In the case where the lead frame comprises a plurality of patterns each of which comprises a die pad and inner leads, the lead frame is optionally divided into a plurality of semiconductor devices each of which contains one semiconductor element.

Herein, the 90°-peel strength at 25° C. between a resin layer A and a lead frame is measured according to the 90° peeling test of JIS Z 0237 by peeling off an adhesive film for semiconductor in a direction of 90° relative to the lead frame. To be concrete, the 90°-peel strength is measured using a 90° peeling tester (produced by Tester Sangyo Kabushiki Kaisha) by peeling an adhesive film for semiconductor at 25° C. at a speed of 270 to 330 mm/min, preferably 300 mm/min.

In the present invention, the 90°-peel strength at 25° C. between the resin layer A and a lead frame is at least 5 N/m, preferably at least 10 N/m, more preferably at least 50 N/m, further preferably at least 100 N/m, particularly preferably at least 150 N/m. A 90°-peel strength of less than 5 N/m may cause the problem that the adhesive film for semiconductor tends to be peeled off from lead frames when conveyed after bonded to the lead frame, and sealing resin enters between lead frames and the resin layer A. The 90°-peel strength is preferably at most 2000 N/m, more preferably at most 1500 N/m, further preferably at most 1000 N/m.

Non-limitative but preferred condition in bonding the adhesive film for semiconductor to a lead frame to measure the peel strength is the same as that described later as to the production of the lead frame of the present invention. For example, a copper lead frame coated with palladium or a 42-alloy lead frame is bonded under any one of the conditions (1) temperature: 250° C., pressure: 8 MPa and time: 10 seconds, (2) temperature: 350° C., pressure: 3 MPa and time: 3 seconds or (3) temperature: 280° C., pressure: 6 MPa and time: 10 seconds.

It is particularly preferable that the 90°-peel strength at 25° C. between the resin layer A and a lead frame is within the above-described range (i.e. at least 5 N/m, preferably at least 10 N/m, more preferably at least 50 N/m) just before the sealing step. In the case where the 90°-peel strength is less than 5 N/m just before the sealing step, there arises the problem that sealing resin enters between the lead frame and the resin layer A in the sealing step.

Herein, the terms "just before the sealing step" mean a point of time before sealing step and after all steps precedent to sealing step.

After the adhesive film for semiconductor is bonded to the lead frame, the bonding strength between the resin layer A and lead frames may be increased by heating before sealing step. The heating temperature is not particularly limited but is preferably 100° C. or higher to increase the bonding strength between the resin layer A and lead frames. In view of the heat resistance of lead frames and the adhesive film for semiconductor, the heating temperature is preferably 300° C. or lower. For the same reason, it is further preferable to heat at 130 to 270° C. The heating time is not particularly limited, and is preferably at least 10 seconds to increase the bonding strength between the resin layer A and lead frames. For the same reason, more preferred heating time is 1 minute to 2 hours. In view of productivity, the heating is preferably performed by the heating in the steps precedent to sealing step (such as the step of curing adhesives such as silver paste, wire-bonding step, etc.). For example, as described above, in the step of bonding semiconductor elements by using an adhesive, heating is generally carried out at 140 to 200° C. for 30 minutes to 2 hours to cure the adhesive used. Further in wire-bonding step, heating is generally carried out at 200 to 270° C. for 3 to 30 minutes. Therefore, the above-mentioned heating can be performed by the heating in these steps.

Herein, as to the 90°-peel strength between the resin layer A and each of a lead frame and a sealing material as measured at a temperature ranging from 0 to 250° C. after sealing with the sealing material, it is measured according to the 90° peeling test of JIS Z 0237 by peeling off the adhesive film for semiconductor in a direction of 90° relative to the lead frame at a room temperature or in an oven heated to 0 to 250° C. To be concrete, the 90°-peel strength is measured with TENSILON RTM-100 (produced by Orientec Co. Ltd.) by peeling an adhesive film for semiconductor at a temperature (at least one temperature) ranging from 0 to 250° C. at a speed of 270 to 330 mm/min, preferably 300 mm/min. The peel strength is preferably measured within a temperature range of 100 to 250° C., more preferably 150 to 250° C.

The 90°-peel strength between the resin layer A and each of a lead frame and a sealing material at a temperature (at least one temperature) ranging from 0 to 250° C. as measured after sealing with a sealing material, is at most 1000 N/m, preferably at most 800 N/m, more preferably at most 500 N/m. In the case where the 90°-peel strength is higher than 1000 N/m, lead frames and sealing materials are broken by stress. Generally, increasing the measuring temperature decreases the 90°-peel strength. The 90°-peel strength is preferably at least 0 N/m, more preferably at least 3 N/m, further preferably at least 5 N/m.

According to the present invention, it is preferable that the adhesive film for semiconductor has a 90°-peel strength of at most 1000 N/m between the resin layer A and each of a lead frame and a sealing material at a temperature at which the adhesive film for semiconductor is peeled off from the lead frame and the sealing material after the lead frame bonded to the adhesive film for semiconductor is sealed with the sealing material. The temperature at which the adhesive film for semiconductor is peeled off from the lead frame and the sealing material after sealing with the sealing material preferably ranges from 0 to 250° C.

Non-limitative but preferred condition in sealing with a sealing material to measure the 90°-peel strength at least at one point of temperatures ranging from 0 to 250° C. is the same as that described later as to the production of the semiconductor device of the present invention. For example, the sealing is preferably carried out at 180° C. at a pressure of 10 MPa for 3 minutes, followed by curing at 180° C. for 5 hours, using CEL-9200 (trade name of a biphenyl sealing material produced by Hitachi Chemical Co., Ltd.).

The adhesive film for semiconductor of the present invention may consist only of the resin layer A, or may have a support film which is coated at least with the resin layer A. For example, in the latter case, the adhesive film for semiconductor has a support film with one or both sides coated with the resin layer A, or has a support film having one side coated with the resin layer A and the other side coated with another resin layer. The preferred are those having a support film.

The method of applying the resin layer A on the support film is not particularly limited. For example, an adhesive film of two- or three-layer structure is obtainable by coating one or both sides of a support film with an adhesive varnish prepared by dissolving a resin (a) for forming the resin layer A in a solvent, such as N-methyl-2-pyrrolidone, dimethylacetamide, diethyleneglycol dimethyl ether, tetrahydrofuran, cyclohexanone, methyl ethyl ketone or dimethylformamide, and then removing the solvent with heat. Alternatively, an adhesive film of two- or three-layer structure is obtainable by dissolving a precursor of the resin (a), which precursor such as a polyamic acid can be converted into the heat resistant resin (a) such as a polyimide by heating after application of its varnish, in a solvent to prepare a precursor varnish, applying it to one or both sides of the support film, and then heating. In this case, by the heating after application, the solvent is removed and the precursor is converted into the resin (a) (such as imidation). Considering the state of the coated surface, an adhesive varnish is preferable.

For the removal of solvents from the applied varnish and the imidation of precursors, if any, the support film coated with the adhesive varnish and that coated with the precursor varnish are heated at different temperatures. Temperatures at which solvents can be removed are sufficient for the adhesive varnish, while the precursor varnish is preferably heated to a temperature causing imidation, which is not lower than the glass transition temperature of the resin layer A.

Non-limitative examples of the method of applying the adhesive varnish or the precursor varnish to the support film include roll coating, reverse roll coating, gravure coating, bar coating and comma coating. Alternatively, the support film may be passed through the adhesive varnish or the precursor varnish.

In the present invention, the resin layer A preferably has a glass transition temperature of 100 to 300° C., more preferably 150 to 300° C., particularly preferably 150 to 250° C. When the adhesive film for semiconductor is peeled off from lead frames and sealing materials, a resin layer A having a glass transition temperature of lower than 100° C. may be peeled off from the support film or be subject to cohesion failure. Also, in wire-bonding step, such a resin layer A tends to soften in heat, leaving the resin on lead frames and sealing materials to cause wire-bonding failure. Further, in sealing step, the resin layer A may also soften in heat, allowing sealing materials to enter between the lead frame and the resin layer A. A resin layer A having a glass transition temperature of higher than 300° C. may be difficult to soften sufficiently at the time of bonding, lowering the 90°-peel strength at 25° C. from lead frames.

In the present invention, the resin layer A loses weight by 5% by weight preferably at a temperature of 300° C. or higher, more preferably 350° C. or higher, further preferably 400° C. or higher. In the case where the resin layer A loses weight by 5% by weight at a temperature lower than 300° C., it may generate outgas with heat in the step of bonding the adhesive film to lead frames or in wire-bonding step, contaminating lead frames and wires. The temperature at which the resin layer A loses weight by 5% by weight was measured by using a differential thermogravimetric balance (TG/DTA 220 produced by Seiko Denshi Kogyo Kabushiki Kaisha) at a temperature raising speed of 10° C./min.

In the present invention, the resin layer A preferably has an elastic modulus of at least 1 MPa at 230° C., more preferably at least 3 MPa. Non-limitative but common wire-bonding temperatures are about 200 to 260° C., generally about 230° C. Therefore, a resin layer A having an elastic modulus of less than 1 MPa at 230° C. may excessively soften in heat in wire-bonding step, causing wire connection failure. The elastic modulus at 230° C. of the resin layer A is preferably at most 2000 MPa, more preferably at most 1500 MPa, particular preferably at most 1000 MPa. The elastic modulus at 230° C. of the resin layer A is measured by a tensile mode at a temperature raising speed of 2° C./min with a measuring frequency of 10 Hz by using a dynamic mechanical analyzer (trade name: DVE RHEO SPECTOLER, produced by Rheology Co., Ltd.).

In the present invention, the resin (a) used for forming the resin layer A is preferably a thermoplastic resin having amide groups (—NHCO—), ester groups (—CO—O—), imide groups

ether groups (—O—) or sulfone groups (—SO$_2$—), particularly preferably a thermoplastic resin having amide groups, ester groups, imide groups or ether groups. Typical examples include aromatic polyamide, aromatic polyester, aromatic polyimide, aromatic polyamideimide, aromatic polyether, aromatic polyether amideimide, aromatic polyether amide, aromatic polyester imide and aromatic polyether imide.

Among these preferred in view of heat resistance and adhesiveness are aromatic polyether amideimide, aromatic polyether imide and aromatic polyether amide.

All of the above-described resins can be produced by polycondensing base components, such as aromatic diamines or bisphenols, with acid components, such as dicarboxylic acids, tricarboxylic acids, tetracarboxylic acids, aromatic chlorides or reactive derivatives thereof. Namely, they can be produced through known methods employed for the reactions of amines with acids, and there are no particular limits in the reaction condition. Known methods can be used for the polycondensation of aromatic dicarboxylic acids, aromatic tricarboxylic acids or reactive derivatives thereof with diamines.

Preferred examples of the base components which may be used to synthesize aromatic polyether imide, aromatic polyether amideimide and aromatic polyether amide include aromatic diamines having ether groups, such as 2,2-bis[4-(4-aminophenoxy) phenyl]propane, bis[4-(4-aminophenoxy) phenyl]sulfone, 4,4'-diaminodiphenyl ether, bis[4-(4-aminophenoxy) phenyl]ether and 2,2-bis[4-(4-aminophenoxy) phenyl]hexafluoropropane; aromatic diamines having no ether groups, such as 4,4'-methylene-bis (2,6-diisopropylamine); siloxane diamines, such as 1,3-bis (3-aminopropyle) tetramethyldisiloxane; and α,ω-diaminoalkanes, such as 1,12-diaminododekane and 1,6-diaminohexane. Preferred base components comprise 40 to 100 mol %, preferably 50 to 97 mol % of aromatic diamines having ether groups and 0 to 60 mol %, preferably 3 to 50 mol % of at least one selected from aromatic diamines having no ether group, siloxane diamines and α,ω-diaminoalkanes, based on the total of the base components. Typical examples of the preferred base components are (1) base components comprising 60 to 89 mol %, preferably 68 to 82 mol % of aromatic diamines having ether groups, 1 to 10 mol %, preferably 3 to 7 mol % of siloxane diamines and 10 to 30 mol %, preferably 15 to 25 mol % of α,ω-diaminoalkanes; (2) base components comprising 90 to 99 mol %, preferably 93 to 97 mol % of aromatic diamines having ether groups and 1 to 10 mol %, preferably 3 to 7 mol % of siloxane diamines; and (3) base components comprising 40 to 70 mol %, preferably 45 to 60 mol % of aromatic diamines having ether groups and 30 to 60 mol %, preferably 40 to 55 mol % of aromatic diamines having no ether groups.

Examples of acid components which may be used to synthesize aromatic polyether imide, aromatic polyether amideimide and aromatic polyether amide include (A) mononuclear tricarboxylic anhydrides or mononuclear tetracarboxylic dianhydrides, such as trimellitic anhydride, reactive derivatives of trimellitic anhydride such as trimellitic anhydride chloride, and pyromellitic dianhydride; (B) polynuclear tetracarboxylic dianhydrides, such as bisphenol A bistrimellitate dianhydride and oxydiphthalic anhydride; and (C) aromatic dicarboxylic acids, such as terephthalic acid, isophthalic acid and reactive derivatives thereof, such as terephthalic chloride and isophthalic chloride.

Particularly preferred are aromatic polyether amideimide obtainable by allowing the acid components (A) to react with the base components (1) or (2) in an amount of 0.95 to 1.05 mol, preferably 0.98 to 1.02 mol per mol of the latter, and aromatic polyether imide obtainable by allowing the acid components (B) to react with the base components (3) in an amount of 0.95 to 1.05 mol, preferably 0.98 to 1.02 mol per mol of the latter.

In the present invention, fillers, such as ceramic powder, glass powder, silver powder, copper powder, resin particles and rubber particles, and coupling agents may be added to the resin (a).

In the case where fillers are added, the amount added is preferably 1 to 30 parts by weight, more preferably 5 to 15 parts by weight, relative to 100 parts by weight of the resin (a).

Examples of coupling agents include vinylsilanes, epoxysilanes, aminosilanes, mercaptosilanes, titanates, aluminum chelate and zirconium aluminate, with silane coupling agents preferred. Examples of silane coupling agents are those terminated by an organic reactive group, such as vinyltriethoxysilane, vinyltriethoxyxilane, vinyl-tris(β-methoxyethoxy) silane, β-(3,4-epoxycyclohexyl) ethyltrimethoxysilane, γ-glycidoxypropyltrimethoxysilane, γ-glycidoxypropylmethyldiethoxysilane, N-β-(aminoethyl)-γ-aminopropylmethyldimethoxysilane, γ-aminopropyltriethoxysilane, N-phenyl-γ-aminopropyltrimethoxysilane and γ-mercaptopropyltrimethoxysilane. Among these preferred are epoxysilane coupling agents having epoxy groups. Herein, organic reactive groups are functional groups, such as epoxy group, vinyl group, amino group and mercapto group. Silane coupling agents are added to improve resin in adhesiveness to support film, thereby preventing resin layers from peeling off from support film at the time of peeling from lead frames and sealing materials at 100 to 300° C. The amount of coupling agents added is preferably 1 to 15 parts by weight, more preferably 2 to 10 parts by weight, relative to 100 parts by weight of the resin (a).

Support films usable in the present invention are not particularly limited, but preferably a film made of a resin tolerable to heat in the steps of applying resins, drying and fabricating semiconductor devices, particularly preferably selected from the group consisting of aromatic polyimide, aromatic polyamide, aromatic polyamideimide, aromatic polysulfone, aromatic polyether sulfone, polyphenylene sulfide, aromatic polyether ketone, polyallylate, aromatic polyether ether ketone and polyethylene naphthalate. To improve heat resistance, the support film preferably has a glass transition temperature of at least 200° C., more preferably at least 250° C. Using the above-described heat resistant resin films prevents support films from softening during the steps using heat, such as bonding step, wire-bonding step, sealing step and peeling step, improving working efficiency.

The support film preferably has sufficiently high adhesion to the resin layer A. When adhesive films are peeled off from lead frames and sealing materials at 100 to 300° C., support films with weak adhesion are subject to delamination on the interface of the resin layer A and the support films, leaving resins on lead frames and sealing materials. The support film preferably has heat resistance and sufficiently high adhesion to the resin layer A, so polyimide film is particularly desirable.

The polyimide film is not particularly limited in kind, but, to decrease the warp of lead frames bonded to the adhesive film for semiconductor, preferably has a linear thermal expansion coefficient of at most $3.0 \times 10^{-5}/°$ C. at 20 to 200° C., more preferably at most $2.5 \times 10^{-5}/°$ C., particularly preferably at most $2.0 \times 10^{-5}/°$ C. To decrease the warp of lead frames bonded to the adhesive film for semiconductor, the polyimide film preferably has a thermal shrinkage ratio of at most 0.15%, more preferably at most 0.1%, further preferably at most 0.05% when heated to 200° C. for 2 hours.

The surface of the support film is preferably treated to increase adhesion to the resin layer A. Non-limitative examples of the surface treatment for the support film include chemical treatments such as alkali treatment and silane coupling treatment, mechanical treatments such as sand mat treatment, plasma treatment and corona treatment.

The thickness of the support film is not particularly limited, but to decrease the warp of lead frames to which the adhesive film for semiconductor is bonded, it is preferably at most 100 μm, more preferably at most 50 μm, further preferably at most 25 μm. The thickness of the support film is preferably at least 5 μm, more preferably at least 10 μm.

The support film may also be made of a material other than the above-described resins, selected from the group consisting of copper, aluminum, stainless steel and nickel. Using a support film made of such metal brings the linear expansion coefficient of the support film closer to that of lead frames, deceasing the warp of lead frames to which the adhesive film for semiconductor is bonded.

In the case where the adhesive film for semiconductor of the present invention has a resin layer on one or each side of a support film, particularly one resin layer A on one side of a support film, the ratio of the thickness (A) of the resin layer A to the thickness of (B) of the support film, (A/B), is preferably at most 0.5, more preferably at most 0.3, further preferably at most 0.2. In the case where the ratio of the thickness (A) of the resin layer A to the thickness of (B) of the support film, (A/B), is more than 0.5, the adhesive film tends to curl due to the volume loss of the resin layer caused by the removal of solvents after application, lowering workability and productivity when bonded to lead frames. In the case where a resin layer is formed on each side of a support film, the ratio of the thickness of one resin layer to that of the other is preferably 0.8:1 to 1.2:1, more preferably 0.9:1 to 1.1:1, particularly preferably 1:1. The thickness (A) of the resin layer A is preferably 1 to 20 μm, more preferably 3 to 15 μm, further preferably 4 to 10 μm.

The support film may have both sides coated with the resin layer A to counterbalance the curl of the adhesive film for semiconductor due to the volume losses of the resin layers A caused by the removal of solvents. It is preferable to coat one side of the support film with the resin layer A and to coat the other side with a resin layer, which hardly softens at high temperatures. That is, it is preferable to coat one side of the support film with the resin layer A having adhesiveness, and the other side with a resin layer (B) which has no adhesiveness and has an elastic modulus of 10 MPa or more at 230° C.

In the present invention, the resin layer B having no adhesiveness preferably has an elastic modulus at 230° C. of at least 10 MPa, more preferably at least 100 MPa, further preferably at least 1000 MPa. A resin layer B having an elastic modulus of less than 10 MPa at 230° C. may soften in the steps using heat such as wire-bonding step, and adhere to molds or jigs. The elastic modulus is preferably at most 2000 MPa, more preferably at most 1500 MPa.

The bonding strength of the resin layer B having no adhesiveness is not particularly limited so far as it is low enough to prevent adhesion to molds and jigs in all steps, and is preferably such that the 90°-peel strength at 250° C. between the resin layer B and molds or jigs is less than 5 N/m, more preferably at most 1 N/m. For example, the peel strength is measured after the resin layer B is pressed against a brass mold for 10 seconds at a temperature of 250° C. with a pressure of 8 MPa.

To prevent the adhesion to molds or jigs caused by softening in bonding step, wire-bonding step, sealing step and peeling step, the resin layer B having an elastic modulus of 10 MPa at 230° C. preferably has a glass transition temperature of at least 150° C., more preferably at least 200° C., further preferably at least 250° C. The glass transition temperature is preferably at most 350° C., more preferably at most 300° C.

The resin layer B is not particularly limited in resin (b) used to form it, and the resin (b) may be either a thermoplastic resin or a thermosetting resin. Usable thermoplastic resins are not particularly limited in composition, and are preferably the thermoplastic resins having amide groups, ester groups, imide groups or ether groups that are mentioned above. Particularly preferred is aromatic polyether amideimide obtainable by allowing the acid components (A) to react with the base components (3) in an amount of 0.95 to 1.05 mol, preferably 0.98 to 1.02 mol per mole of the latter. Usable thermosetting resins are not particularly limited in composition, and are preferably epoxy resin, phenolic resin or bismaleimide resin (such as one obtainable by using bis(4-maleimidophenyl)methane as a monomer). A mixture of a thermoplastic resin and a thermosetting resin may also be used. In a mixture of a thermoplastic resin and a thermosetting resin, the thermosetting resin is preferably 5 to 100 parts by weight, more preferably 20 to 70 parts by weight relative to 100 parts by weight of the thermoplastic resin.

To the resin (b) may be added fillers, such as ceramic powder, glass powder, silver powder, copper powder, resin particles or rubber particles, and coupling agents. In the case where fillers are added, the amount is preferably 1 to 30 parts by weight, more preferably 5 to 15 parts by weight relative to 100 parts by weight of the resin (b). The amount of coupling agents is preferably 1 to 20 parts by weight, more preferably 5 to 15 parts by weight relative to 100 parts by weight of the resin (b).

The method of forming the resin layer B having no adhesiveness on the support film is not particularly limited. For example, the resin layer B is formed by applying a resin varnish of the resin (b) dissolved in a solvent, such as N-methyl-2-pyrrolidone, dimethylacetamide, diethyleneglycol dimethyl ether, tetrahydrofuran, cyclohexanone, methyl ethyl ketone or dimethylformamide, to the support film, and then removing the solvent by heating. Alternatively, it may be formed by dissolving a precursor of the resin (b), which precursor such as a polyamidic acid can be converted into the heat resistant resin (b) such as a polyimide resin by heating after application of its varnish, in a solvent to prepare a precursor varnish, applying it to the support film, and then heating. In this case, by the heating after application, the solvent is removed and the precursor is converted into the resin (b). In view of the state of the coated surface, a resin varnish is preferable.

For the removal of solvents from the applied varnish and the imidation of precursors if any, the support film coated with the resin varnish and that coated with the precursor varnish are heated at different temperatures. Temperatures at which solvents can be removed are sufficient for the resin varnish, while the precursor varnish is preferably heated to a temperature causing imidation, which is not lower than the glass transition temperature of the resin layer B.

In the case where a thermosetting resin or a combination of a thermoplastic resin and a thermosetting resin is used as the resin (b), the elastic modulus of the resin layer B may also be adjusted to 10 MPa or more by curing the thermosetting resin by heating after application. The heating may be performed either at the same time of or after the heating for removing solvents or imidation.

Curl of the adhesive film for semiconductor due to the volume loss of the resin layer A is compensated by the volume loss of the resin layer B at the time of removing solvents or the shrinkage of the resin layer B due to imidation or curing of thermosetting resins.

Non-limitative examples of the method of applying the resin varnish or the precursor varnish to the support film are roll coating, reverse roll coating, gravure coating, bar coating and comma coating. Alternatively, the support film may be passed through the resin varnish or the precursor varnish.

Lead Frame

For example, the lead frame of the present invention may be produced by bonding the adhesive film for semiconductor of the present invention to a lead frame with the resin layer A contacting one side of a lead frame.

The condition during bonding the adhesive film for semiconductor to a lead frame is not particularly limited, and the bonding temperature is preferably 150 to 400° C., more preferably 180 to 350° C., further preferably 200 to 300° C. Bonding temperatures lower than 150° C. may decrease the 90°-peel strength between the lead frame and the resin layer A. Bonding temperatures higher than 400° C. may deteriorate lead frames.

The pressure for bonding the adhesive film for semiconductor to a lead frame is preferably 0.5 to 30 MPa, more preferably 1 to 20 MPa, further preferably 3 to 1.5 MPa. Bonding pressures lower than 0.5 MPa may decrease the 90-peel strength between the lead frame and the resin layer A. Bonding pressure higher than 30 MPa may break lead frames.

The time for bonding the adhesive film for semiconductor to a lead frame is preferably 0.1 to 60 seconds, more preferably 1 to 30 seconds, further preferably 0.3 to 20 seconds. Bonding times shorter than 0.1 second may decrease the 90°-peel strength between the lead frame and the resin layer A. Bonding times longer than 60 seconds may lower the working efficiency and productivity. Before pressure is applied, pre-heating is preferably carried out for about 5 to 60 seconds.

Lead frames usable in the present invention are not particularly limited in material, and examples include iron alloys, such as 42 alloy, copper or copper alloys. Copper or copper alloy lead frames may be coated with palladium, gold or silver.

Semiconductor Device

The semiconductor device of the present invention produced by using the adhesive film for semiconductor is not particularly limited in structure, and examples are packages wherein only one side (the side bearing semiconductor elements) is sealed to expose lead frames on the other side to use the exposed surface for external connection (Non Lead Type Packages). Examples of packages of such a structure include QFN (Quad Flat Non-leaded Package) and SON (Small Outline Non-leaded Package).

For example, the semiconductor device of the present invention is produced by peeling of an adhesive film for semiconductor from an adhesive film-bearing semiconductor device comprising
  the adhesive film for semiconductor,
  a lead frame bonded to the adhesive film for semiconductor with one side of the lead frame contacting the resin layer A,
  a semiconductor element bonded to a die pad on another side of the lead frame,
  a wire connecting the semiconductor element and an inner lead of the lead frame, and
  a sealing material which seals the semiconductor element and the wire.

The semiconductor device produced by using the adhesive film for semiconductor of the present invention has excellent capability for increasing high density and decreasing area and thickness, and incorporated for example in information apparatuses, such as pocket telephones.

Method of Producing Semiconductor Device

The method of the present invention for producing a semiconductor device comprises
  a step of bonding an adhesive film for semiconductor to a side of a lead frame having inner leads and a die pad,
  a step of bonding a semiconductor element to a die pad on the other exposed side of the lead frame,
  a step of connecting the semiconductor element to the inner leads with wires by wire-bonding,
  a step of sealing the exposed side of the lead frame, the semiconductor element and the wires with a sealing material, and
  a step of peeling off the adhesive film for semiconductor from the lead frame and the sealing material.

In the case where the lead frame comprises a plurality of patterns each of which comprises a die pad and inner leads, the sealed lead frame is optionally divided into a plurality of semiconductor devices each of which contains one semiconductor element. The division step may be carried out either after the step of sealing or after the step of peeling off the adhesive film for semiconductor.

The adhesive film for semiconductor used in the above-described method is not particularly limited. For example, the adhesive film for semiconductor or the lead frame of the present invention are suitable for the method.

Examples of usable lead frames and suitable condition for bonding an adhesive film for semiconductor to a lead frame is the same as that described relating to the production of the lead frame of the present invention.

Non-limitative examples of adhesives usable for bonding a semiconductor element to the die pad of a lead frame include adhesives of paste form, such as silver paste, and adhesive tapes. After a semiconductor element is bonded to the die pad, the adhesive is generally cured with heat at 140 to 200° C. for 30 minutes to 2, hours.

A non-limitative example of the material of the wires usable for wire-bonding is gold. For example, wires are bonded to the semiconductor element and the inner leads of the lead frame by heating them to 200 to 270° C. for 3 to 30 minutes.

Non-limitative examples of sealing materials usable in the present invention include epoxy resins, such as cresol novolak epoxy resin, phenol novolak epoxy resin, biphenyl diepoxy and naphthol novolak epoxy resin.

To the sealing material may be added additives, such as fillers, and non-flammable materials, such as brominated compounds. The condition during sealing with a sealing material is not particularly limited, and sealing is generally performed by heating at 150 to 200° C. for 2 to 5 minutes at a pressure of 10 to 15 MPa.

After sealing with a sealing material, the adhesive film for semiconductor is peeled off preferably at a temperature of 0 to 250° C. At temperatures lower than 0° C., resins tend to remain on the lead frame and the sealing material. At temperatures higher than 250° C., the lead frame and the sealing material may be deteriorated. For the same reason, the temperature of more preferably 100 to 200° C., particularly preferably 150 to 250° C.

In general, after sealing with a sealing material, the sealing material is cured by heating at 150 to 200° C. for several hours. The step of peeling off the adhesive film for semiconductor from the lead frame and the sealing material may be carried out either before or after the step of curing the sealing material.

It is desirable that after sealing with a sealing material, the adhesive film for semiconductor can be peeled off at 0 to 250%, without leaving resin residue on the sealing material and the lead frame. If a large amount of the resin is left, the appearance will be deteriorated, and the lead frame may case connection failure when used for external connection.

It is therefore preferable to remove the resin remaining on the lead frame and the sealing material by mechanical blushing or solvents. Non-limitative but preferred examples of usable solvents include N-methyl-2-pyrrolidone, dimethylacetamide, diethyleneglycol dimethyl ether, tetrahydrofuran, cyclohexanone, methyl ethyl ketone and dimethylformamide.

EXAMPLES

Hereinafter, the present invention will be described in detail referring to examples, which however do not limit the scope of the invention.

Preparation Example 1

Preparation of the Aromatic Polyether Amideimide Adhesive Varnish Used in Examples 1-4, 7 and 8

Into a 5-liter four neck distillation flask equipped with a thermometer, a stirrer, a nitrogen inlet tube and a fractionating column were placed 258.3 g (0.63 mol) of 2,2-bis [4-(4-aminophenoxy)phenyl]propane and 10.4 g (0.042 mol) of 1,3-bis(3-aminopropyl)tetramethyldisiloxane, and dissolved in 1450 g of N-methyl-2-pyrrolidone. The solution was heated to 70° C., and 33.6 g (0.168 mol) of 1,12-diaminododecane was dissolved therein. The solution was cooled to 0° C., and 180.4 g (0.857 mol) of trimellitic anhydride chloride was added. After the trimellitic anhydride chloride was dissolved, 130 g of triethylamine was added. After stirring for 2 hours at room temperature, the temperature was raised to 180° C. and reaction was carried out for 5 hours to complete imidation. The resulting reaction solution was poured in methanol to separate a polymer. After dried, the polymer was dissolved in N-methyl-2-pyrrolidone, and separated again in methanol. Drying under reduced pressure was carried out to obtain a purified polyether amideimide powder. 120 g of the polyether amideimide powder and 6 g of a silane coupling agent (produced by Shin-Etsu Chemical Co., Ltd., trade name: SH 6040) were dissolved in 360 g of N-methyl-2-pyrrolidone, to obtain an aromatic polyether amideimide adhesive varnish.

Preparation Example 2

Preparation of the Aromatic Polyether Amideimide Adhesive Varnish Used in Examples 5 and 6

Into a 5-liter four neck distillation flask equipped with a thermometer, a stirrer, a nitrogen inlet tube and a fractionating column were placed 258.6 g (0.63 mol) of 2,2-bis [4-(4-aminophenoxy)phenyl]propane and 67.0 g (0.27 mol) of 1,3-bis(3-aminopropyl)tetramethyldisiloxane, and dissolved in 1550 g of N-methyl-2-pyrrolidone. The solution was cooled to 0° C., and 187.3 g (0.89 mol) of trimellitic anhydride chloride was added at the same temperature. After the trimellitic anhydride chloride was dissolved, 100 g of triethylamine was added. After stirring for 2 hours at room temperature, the temperature was raised to 180° C. and reaction was carried out for 5 hours to complete imidation. The resulting reaction solution was poured in methanol to separate a polymer. After dried, the polymer was dissolved in N-methyl-2-pyrrolidone, and separated again in methanol. Drying under reduced pressure was carried out to obtain a purified polyether amideimide powder. 120 g of the polyether amideimide powder and 3.6 g of a silane coupling agent (produced by Shin-Etsu Chemical Co., Ltd., trade name: SH 6040) were dissolved in 360 g of N-methyl-2-pyrrolidone, to obtain an aromatic polyether amideimide adhesive varnish.

Preparation Example 3

Preparation of the Aromatic Polyether Amideimide Varnish Used for Forming a Resin Layer B in Example 5

Into a 5-liter four neck distillation flask equipped with a thermometer, a stirrer, a nitrogen inlet tube and a fractionating column were placed 172.4 g (0.42 mol) of 2,2-bis [4-(4-aminophenoxy)phenyl]propane and 153.7 g (0.42 mol) of 4,4'-methylene-bis(2,6-diisopropylaniline), and dissolved in 1550 g of N-methyl-2-pyrrolidone. The solution was cooled to 0° C., and 174.7 g (0.83 mol) of trimellitic anhydride chloride was added at the same temperature. After the trimellitic anhydride chloride was dissolved, 130 g of triethylamine was added. After stirring for 2 hours at room temperature, the temperature was raised to 180° C. and reaction was carried out for 5 hours to complete imidation. The resulting reaction solution was poured in methanol to separate a polymer. After dried, the polymer was dissolved in N-methyl-2-pyrrolidone, and separated again in methanol. Drying under reduced pressure was carried out to obtain a purified polyether amideimide powder. 120 g of the polyether amideimide powder and 6 g of a silane coupling agent (produced by Shin-Etsu Chemical Co., Ltd., trade name: SH 6040) were dissolved in 360 g of N-methyl-2-pyrrolidone, to obtain an aromatic polyether amideimide varnish.

Preparation Example 4

Preparation of the Aromatic Polyether Amideimide Powder Used for Forming the Resin Layer B in Example 6

Into a 5-liter four neck distillation flask equipped with a thermometer, a stirrer, a nitrogen inlet tube and a fractionating column were placed 270.9 g (0.66 mol) of 2,2-bis [4-(4-aminophenoxy)phenyl]propane and 8.7 g (0.035 mol) of 1,3-bis(3-aminopropyl)tetramethyldisiloxane, and dissolved in 1950 g of N-methyl-2-pyrrolidone. The solution was cooled to 0° C., and 149.5 g (0.71 mol) of trimellitic anhydride chloride was added at the same temperature. After the trimellitic anhydride chloride was dissolved, 100 g of triethylamine was added. After stirring for 2 hours at room temperature, the temperature was raised to 180° C. and reaction was carried out for 5 hours to complete imidation. The resulting reaction solution was poured in methanol to separate a polymer. After dried, the polymer was dissolved in N-methyl-2-pyrrolidone, and separated again in methanol. Drying under reduced pressure was carried out to obtain a purified polyether amideimide powder.

Preparation Example 5

Preparation of the Aromatic Polyether Amideimide Adhesive Varnish Used in Example 9

120 g of the polyether amideimide powder produced in Preparation Example 4 and 3.6 g of a silane coupling agent (produced by Shin-Etsu Chemical Co., Ltd., trade name: SH 6040) were dissolved in 360 g of N-methyl-2-pyrrolidone, to obtain an aromatic polyether amideimide adhesive varnish.

Preparation Example 6

Preparation of the Aromatic Polyether Imide Adhesive Varnish Used in Example 10

Into a 5-liter four neck distillation flask equipped with a thermometer, a stirrer, a nitrogen inlet tube and a fractionating column were placed 102.5 g (0.25 mol) of 2,2-bis [4-(4-aminophenoxy)phenyl]propane and 91.5 g (0.25 mol) of 4,4'-methylene-bis(2,6-diisopropylaniline), and dissolved in 1900 g of N-methyl-2-pyrrolidone. The solution was cooled to 0° C., and 282.2 g (0.49 mol) of bisphenol A bistrimellitate dianhydride was added at the same temperature. After stirring for 20 minutes at room temperature and then for 2 hours at 60° C., the temperature was raised to 180° C. and reaction was carried out for 5 hours to complete imidation. The resulting reaction solution was poured in methanol to separate a polymer. After dried, the polymer was dissolved in N-methyl-2-pyrrolidone, and separated again in methanol. Drying under reduced pressure was carried out to obtain a purified polyether imide powder. 120 g of the polyether imide powder was dissolved in 360 g of N-methyl-2-pyrrolidone, to obtain an aromatic polyether imide adhesive varnish.

Preparation Example 7

Preparation of the Aromatic Polyether Amideimide Adhesive Varnish Used in Examples 11 and 12

Into a 5-liter four neck distillation flask equipped with a thermometer, a stirrer, a nitrogen inlet tube and a fractionating column were placed 250.9 g (0.58 mol) of 2,2-bis [4-(4-aminophenoxy)phenyl]sulfone and 7.4 g (0.03 mol) of 1,3-bis(3-aminopropyl)tetramethyldisiloxane, and dissolved in 1500 g of N-methyl-2-pyrrolidone. The solution was cooled to 0° C., and 126.3 g (0.6 mol) of trimellitic anhydride chloride was added at the same temperature. After the trimellitic anhydride chloride was dissolved, 67 g of triethylamine was added.

After stirring for 2 hours at room temperature, the temperature was raised to 180° C. and reaction was carried out for 5 hours to complete imidation. The resulting reaction solution was poured in methanol to separate a polymer. After dried, the polymer was dissolved in N-methyl-2-pyrrolidone, and separated again in methanol. Drying under reduced pressure was carried out to obtain a purified polyether amideimide powder. 120 g of the polyether amideimide powder and 6.0 g of a silane coupling agent (produced by Shin-Etsu Chemical Co., Ltd., trade name: SH 6040) were dissolved in 360 g of N-methyl-2-pyrrolidone, to obtain an aromatic polyether amideimide adhesive varnish.

Preparation Example 8

Preparation of the Polysiloxane Polyamide Block Copolymer Adhesive Varnish Used in Comparative Example 1

Into a 5-liter four neck distillation flask equipped with a thermometer, a stirrer, a nitrogen inlet tube and a fractionating column were placed 295.2 g (0.72 mol) of 2,2-bis [4-(4-aminophenoxy)phenyl]propane and 540 g (0.18 mol) of a silicone diamine (produced by Shin-Etsu Chemical Co., Ltd., trade name: X-22-161B), and dissolved in 2400 g of diethyleneglycol dimethyl ether. The solution was cooled to −10° C., and 188.8 g (0.93 mol) of isophthalic chloride was added at the same temperature. After stirring for 1 hour, 214 g of propylene oxide was added. After stirring was carried out at room temperature for 30 minutes, the temperature was raised to 40° C. and reaction was carried out for 5 hours. The resulting reaction solution was poured in methanol to separate a polymer. After dried, the polymer was dissolved in dimethylformamide, and separated again in methanol. Drying under reduced pressure was carried out to obtain a purified polysiloxane polyamide block copolymer powder. 120 g of the resin powder and 6.0 g of a silane coupling agent (produced by Shin-Etsu Chemical Co., Ltd., trade name: SH 6040) were dissolved in 360 g of N-methyl-2-pyrrolidone, to obtain a polysiloxane polyamide block copolymer adhesive varnish.

Example 1

Figure 2:
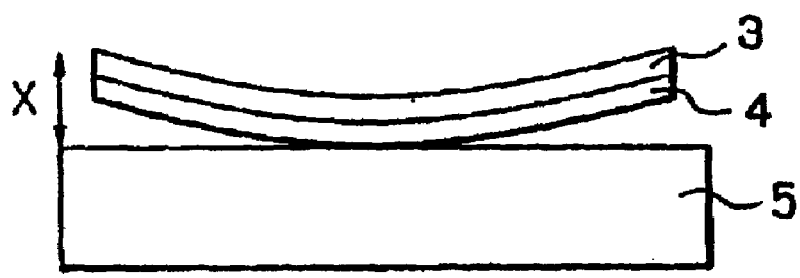
FIG. 2 is a side view illustrating a method of measuring the degree of the warp of a lead frame to which an adhesive film for semiconductor is bonded.
Figure 3:
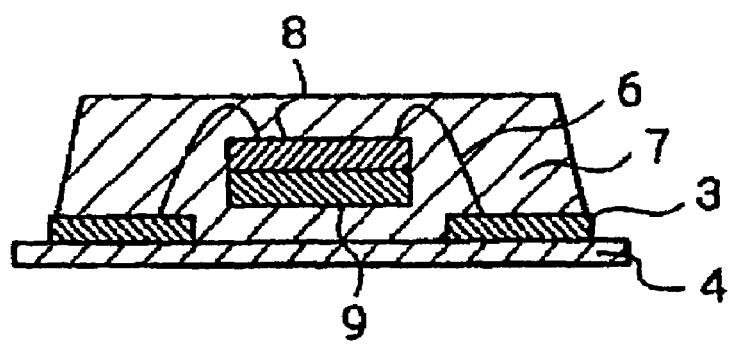
FIG. 3 is a sectional view of a semiconductor device of an embodiment according to the present invention.
Figure 4:
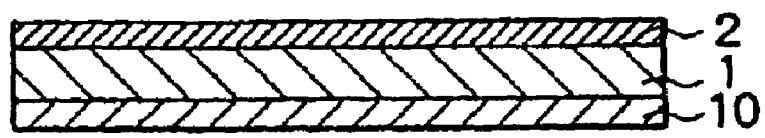
FIG. 4 is a sectional view of an adhesive film for semiconductor of an embodiment according to the present invention.

A 125 μm thick polyimide film (produced by Ube Industries, Ltd., trade name: UPILEX SGA) having a chemically treated surface was used as a support film. The aromatic polyether amideimide adhesive varnish produced in Preparation Example 1 was spread to 90 μm thick on one side of the polyimide film, dried at 100° C. for 10 minutes and at 300° C. for 10 minutes, to obtain an adhesive film for semiconductor of the structure as shown in FIG. 1, which comprised a support film (1) with one side coated with a 25 μm thick resin layer A (2). The adhesive layer A had a glass transition temperature of 195° C., a 5-wt % loss in weight temperature of 421° C. and an elastic modulus of 7 MPa at 230° C. The ratio of the thickness (A) of the resin layer A (2) to the thickness (B) of the support film (1), (A/B), was 0.2. The adhesive film was bonded to a palladium-coated copper lead frame (50 mm×200 mm) at a temperature of 250° C. for 10 seconds with a pressure of 8 MPa. The 90°-peel strength (peeling speed: 300 mm/min, the same shall apply hereinafter) at 25° C. between the resin layer A and the lead frame was measured to be 150 N/m, and no trouble of peeling occurred during conveyance. The adhesive film for semiconductor curled little, and could be handled easily when bonded. As shown in FIG. 2, the lead frame (3) to which the adhesive film for semiconductor (4) was bonded was placed on a platform (5), and the degree of warp (X) in the longitudinal direction was measured to be about 5 mm. By using the lead frame with the adhesive film for semiconductor bonded thereto, bonding of semiconductor elements, wire-bonding and sealing were carried out. The obtained package had a structure wherein a plurality of packages each as shown in FIG. 3 were joined together. A silver paste was used to bond semiconductor elements, and cured by heating at 150° C. for 60 minutes. Wire-bonding was carried out by using gold wires by heating at 260° C. for 5 minutes. In sealing step, sealing was carried out at the conditions of a temperature of 180° C., a pressure of 10 MPa and a time of 3 minutes by using a biphenyl sealing material (trade name: CEL-9200, produced by Hitachi Chemical Co., Ltd.) as a sealing material, and the sealing resin was then cured by heating at 180° C. for 5 hours. No trouble occurred in every step. In FIGS. 3, 4 is an adhesive film for semiconductor, 6 is a wire, 7 is a sealing material, 3 is a lead frame, 8 is a semiconductor element, and 9 is a die pad (silver paste is not shown). When peeled off from the lead frame and the sealing material at 235° C. after sealing (peeling speed: 300 mm/min, the same shall apply hereinafter), the adhesive film for semiconductor could be peeled off easily with a 90°-peel strength of 330 N/m, leaving little resin residue on the lead frame and the sealing material. The very little resin residue could be washed off with N-methyl-2-pyrrolidone.

When the resulting package was divided into a plurality of semiconductor devices each of which had one semiconductor element, no trouble occurred.

Example 2

An adhesive film for semiconductor was produced in the same manner as in Example 1 except that a 50 μm thick polyimide film (produced by Ube Industries, Ltd., trade name: UPILEX SGA) having a chemically treated surface was used as the support film. The ratio of the thickness (A) of the resin layer A to the thickness (B) of the support film, (A/B), was 0.5. The adhesive film was bonded to a palladium-coated copper lead frame at a temperature of 250° C. for 10 seconds with a pressure of 8 MPa. The 90°-peel strength at 25° C. between the resin layer A and the lead frame was measured to be 150 N/m, and no trouble of peeling occurred during conveyance. The adhesive film for semiconductor curled little, and could be handled easily when bonded. The degree of warp of the lead frame as measured after bonding as shown in FIG. 2 was about 1 mm. By using the lead frame with the adhesive film for semiconductor bonded thereto, the steps of bonding semiconductor elements, wire-bonding and sealing were carried out in the same manner as in Example 1, to obtain a package having a structure wherein a plurality of packages each as shown in FIG. 3 were joined together. No trouble occurred in every step. When peeled off from the lead frame and the sealing material at 235° C. after sealing, the adhesive film for semiconductor could be peeled off easily with a 90°-peel strength of 300 N/m, leaving very little resin residue on the lead frame and the sealing material.

Example 3

An adhesive film for semiconductor was produced in the same manner as in Example 1 except that a 25 μm thick polylmide film (produced by Ube Industries, Ltd., trade name: UPILEX SGA) having a chemically treated surface was used as the support film. The ratio of the thickness (A) of the resin layer A to the thickness (B) of the support film, (A/B), was 1.0. The adhesive film was bonded to a palladium-coated copper lead frame at a temperature of 250° C. for 10 seconds with a pressure of 8 MPa. The 90°-peel strength at 25° C. between the resin layer A and the lead frame was measured to be 150 N/m, and no trouble of peeling occurred during conveyance. The adhesive film for semiconductor somewhat curled, but could be handled easily when bonded. The degree of warp of the lead frame as measured after bonding as shown in FIG. 2 was about 0.5mm. By using the lead frame with the adhesive film for semiconductor bonded thereto, the steps of bonding semiconductor elements, wire-bonding and sealing and cutting were carried out in the same manner as in Example 1, to obtain a package having a structure wherein a plurality of packages each as shown in FIG. 3 were joined together. No trouble occurred in every step. When peeled off from the lead frame and the sealing material at 235° C. after sealing, the adhesive film for semiconductor could be peeled off easily with a 90°-peel strength of 300 N/m, leaving very little resin residue on the lead frame and the sealing material.

Example 4

An adhesive film for semiconductor was produced in the same manner as in Example 1 except that a 125 μm thick polylmide film (produced by Ube Industries, Ltd., trade name: UPILEX SPA) having a plasma treated surface was used as the support film. The ratio of the thickness (A) of the resin layer A to the thickness (B) of the support film, (A/B), was 0.2. The adhesive film was bonded to a palladium-coated copper lead frame at a temperature of 250° C. for 10 seconds with a pressure of 8 MPa. The 90°-peel strength at 25° C. between the resin layer A and the lead frame was measured to be 150 N/m, and no trouble of peeling occurred during conveyance. The adhesive film for semiconductor curled little, and could be handled easily when bonded. The degree of warp of the lead frame as measured after bonding as shown in FIG. 2 was about 5 mm. By using the lead frame with the adhesive film for semiconductor bonded thereto, the steps of bonding semiconductor elements, wire-bonding and sealing were carried out in the same manner as in Example 1, to obtain a package having a structure wherein a plurality of packages each as shown in FIG. 3 were joined together. No trouble occurred in every step. When peeled off from the lead frame and the sealing material at 235° C. after sealing, the adhesive film for semiconductor could be peeled off easily with a 90-peel strength of 330 N/m, leaving very little resin residue on the lead frame and the sealing material.

Example 5

A 25 μm thick polyimide film (produced by Ube Industries, Ltd., trade name: UPILEX SPA) having a plasma treated surface was used as the support film. The aromatic polyether amideimide adhesive varnish produced in Preparation Example 2 was spread to 50 μm thick on one side of the polyimide film, and dried at 100° C. for 10 minutes and at 300° C. for 10 minutes, to form a 10 μm thick resin layer A. The resin layer A had a glass transition temperature of 187° C., a 5-wt % loss in weight temperature of 429° C. and an elastic modulus of 5 MPa at 230° C. On the other side of the polyimide film, the aromatic polyether amideimide resin varnish produced in Preparation Example 3 was spread to 50 μm thick, and dried at 100° C. for 10 minutes and at 300° C. for 10 minutes, to form a 10 μm thick resin layer B. The resin layer B had a glass transition temperature of 260° C., a 5-wt % loss in weight temperature of 421° C. and an elastic modulus of 1700 MPa at 230° C. Thus an adhesive film for semiconductor as shown FIG. 4 which had a support film (1) having one side coated with the resin layer A (2) and the other side coated with the resin layer B (12) was obtained.

The adhesive film was bonded to a palladium-coated copper lead frame at a temperature of 250° C. for 10 seconds with a pressure of 8 MPa. The 90°-peel strength at 25° C. between the resin layer A and the lead frame was measured to be 150 N/m, and no trouble of peeling occurred during conveyance. The adhesive film for semiconductor curled very little, and could be handled easily when bonded. The degree of warp of the lead frame as measured after bonding as shown in FIG. 2 was about 0.15 mm. By using the lead frame with the adhesive film for semiconductor bonded thereto, the steps of bonding semiconductor elements, wire-bonding and sealing were carried out in the same manner as in Example 1, to obtain a package having a structure wherein a plurality of packages each as shown in FIG. 3 were joined together. No trouble occurred in every step. When peeled off from the lead frame and the sealing material at 205° C. after sealing, the adhesive film for semiconductor could be peeled off easily with a 90°-peel strength of 300 N/m, leaving very little resin residue on the lead frame and the sealing material.

Example 6

A 25 μm thick polyimide film (produced by Ube Industries, Ltd., trade name: UPILEX SGA) having a chemically treated surface was used as the support film. The aromatic polyether amideimide adhesive varnish produced in Preparation Example 2 was spread to 50 μm thick on one side of the polyimide film, and dried at 100° C. for 10 minutes and at 300° C. for 10 minutes, to form a 10 μm thick resin layer A. The resin layer A had a glass transition temperature of 187° C., a 5-wt % loss in weight temperature of 429° C. and an elastic modulus of 5 MPa at 230° C. On the other side of the polylmide film, a resin varnish, which was produced by mixing the aromatic polyether amideimide powder (glass transition temperature: 230° C.) prepared in Preparation Example 4 and bis(4-maleimidephenyl)methane in a weight ratio of 6/4 (the former/the latter), was spread to 50 μm thick, and dried at 100° C. for 10 minutes and at 300° C. for 10 minutes, to form a 10 μm thick resin layer B. The resin layer B had an elastic modulus of 500 MPa at 230° C. Thus an adhesive film for semiconductor as shown FIG. 4 which had a support film (1) having one side coated with the resin layer A (2) and the other side coated with the resin layer B (12) was obtained.

The adhesive film was bonded to a palladium-coated copper lead frame at a temperature of 250° C. for 10 seconds with a pressure of 8 MPa. The 90°-peel strength at 25° C. between the resin layer A and the lead frame was measured to be 150 N/m, and no trouble of peeling occurred during conveyance. The adhesive film for semiconductor curled very little, and could be handled easily when bonded. The degree of warp as measured as shown in FIG. 2 was about 0.15 mm. By using the lead frame with the adhesive film for semiconductor bonded thereto, the steps of bonding semiconductor elements, wire-bonding and sealing were carried out in the same manner as in Example 1, to obtain a package having a structure wherein a plurality of packages each as shown in FIG. 3 were joined together. No trouble occurred in every step. When peeled off from the lead frame and the sealing material at 205° C. after sealing, the adhesive film for semiconductor could be peeled off easily with a 90°-peel strength of 300 N/m, leaving very little resin residue on the lead frame and the sealing material.

Example 7

An adhesive film for semiconductor was produced in the same manner as in Example 1 except that a 125 μm thick polyethylene naphthalate film (produced by Teijin, Ltd., trade name: TEONEX) was used in place of the 125 μm thick polylmide film (produced by Ube Industries, Ltd., trade name: UPILEX SGA) having a chemically treated surface was used as the support film. The ratio of the thickness (A) of the resin layer A to the thickness (B) of the support film, (A/B), was 0.2. The adhesive film was bonded to a palladium-coated copper lead frame at a temperature of 250° C. for 10 seconds with a pressure of 8 MPa. The 90°-peel strength at 25° C. between the resin layer A and the lead frame was measured to be 150 N/m, and no trouble of peeling occurred during conveyance. The adhesive film for semiconductor somewhat curled, but could be handled easily when bonded. The degree of warp of the lead frame as measured after bonding as shown in FIG. 2 was about 5 mm. By using the lead frame with the adhesive film for semiconductor bonded thereto, the steps of bonding semiconductor elements, wire-bonding and sealing were carried out in the same manner as in Example 1, to obtain a package having a structure wherein a plurality of packages each as shown in FIG. 3 were joined together. No trouble occurred in every step. When peeled off from the lead frame and the sealing material at 235° C. after sealing, the adhesive film for semiconductor could be peeled off easily with a 90°-peel strength of 330 N/m, leaving very little resin residue on the lead frame and the sealing material.

Example 8

An adhesive film for semiconductor was produced in the same manner as in Example 1, and bonded to a 42 alloy lead frame at a temperature of 350° C. with a pressure of 3 MPa for a time of 3 seconds. The 90°-peel strength at 25° C. between the resin layer A and the lead frame was measured to be 800 N/m, and no trouble of peeling occurred during conveyance. The adhesive film for semiconductor curled little, and could be handled easily when bonded. The degree of warp of the lead frame as measured after bonding as shown in FIG. 2 was about 4 mm. By using the lead frame with the adhesive film for semiconductor bonded thereto, the steps of bonding semiconductor elements, wire-bonding and sealing were carried out in the same manner as in Example 1, to obtain a package having a structure wherein a plurality of packages each as shown in FIG. 3 were joined together. No trouble occurred in every step. When peeled off from the lead frame and the sealing material at 235° C. after sealing, the adhesive film for semiconductor could be peeled off easily with a 90°-peel strength of 250 N/m, leaving very little resin residue on the lead frame and the sealing material.

Example 9

An adhesive film for semiconductor was produced in the same manner as in Example 1 except that the aromatic polyether amideimide adhesive varnish prepared in Preparation Example 5 was used for forming the resin layer A. The resin layer A had a glass transition temperature of 230° C., a 5-wt % loss in weight temperature of 451° C. and an elastic modulus of 150 MPa at 230° C. The adhesive film was bonded to a palladium-coated copper lead frame at a temperature of 250° C. for 10 seconds with a pressure of 8 MPa. The 90°-peel strength at 25° C. between the resin layer A and the lead frame was measured to be 50 N/m, and no trouble of peeling occurred during conveyance. The adhesive film for semiconductor curled little, and could be handled easily when bonded. The degree of warp of the lead frame as measured after bonding as shown in FIG. 2 was about 5 mm. By using the lead frame with the adhesive film for semiconductor bonded thereto, the steps of bonding semiconductor elements, wire-bonding and sealing were carried out in the same manner as in Example 1, to obtain a package having a structure wherein a plurality of packages each as shown in FIG. 3 were joined together. No trouble occurred in every step. When peeled off from the lead frame and the sealing material at 205° C. after sealing, the adhesive film for semiconductor could be peeled off easily with a 90°-peel strength of 300 N/m, leaving very little resin residue on the lead frame and the sealing material.

Example 10

An adhesive film for semiconductor was produced in the same manner as in Example 1 except that the aromatic polyether imide adhesive varnish prepared in Preparation Example 6 was used for forming the resin layer A. The resin layer A had a glass transition temperature of 240° C., a 5-wt % loss in weight temperature of 410° C. and an elastic modulus of 300 MPa at 230° C. The adhesive film was bonded to a palladium-coated copper lead frame at a temperature of 250° C. for 10 seconds with a pressure of 8 MPa. The 90°-peel strength at 25° C. between the resin layer A and the lead frame was measured to be 50 N/m, and no trouble of peeling occurred during conveyance. The adhesive film for semiconductor curled little, and could be handled easily when bonded. The degree of warp of the lead frame as measured after bonding as shown in FIG. 2 was about 5 mm. By using the lead frame with the adhesive film for semiconductor bonded thereto, the steps of bonding semiconductor elements, wire-bonding and sealing were carried out in the same manner as in Example 1, to obtain a package having a structure wherein a plurality of packages each as shown in FIG. 3 were joined together. No trouble occurred in every step. When peeled off from the lead frame and the sealing material at 235° C. after sealing, the adhesive film for semiconductor could be peeled off easily with a 90°-peel strength of 600 N/m, leaving very little resin residue on the lead frame and the sealing material.

Example 11

A 25 μm thick polyimide film (produced by Toray Du Pont Co., Ltd., trade name: KAPTON EN, linear thermal expansion coefficient at 20 to 200° C.: 15×10$^{-5}$/° C., shrinkage ratio after heating at 200° C. for 2 hours: 0.02%) having a sand mat treated surface was used as a support film. The aromatic polyether amideimide adhesive varnish prepared in Preparation Example 7 was spread to 25 μm thick on one side of the polyimide film, and dried at 100° C. for 10 minutes and at 300° C. for 10 minutes, to obtain an adhesive film for semiconductor of the structure as shown in FIG. 1, which had a support film having one side coated with a 4 μm thick resin layer A. The resin layer A had a glass transition temperature of 260° C., a 5-wt % loss in weight temperature of 430° C. and an elastic modulus of 1500 MPa at 230° C.

The adhesive film for semiconductor was bonded to a palladium-coated copper lead frame at a temperature of 280° C. for 10 seconds with a pressure of 6 MPa. The 90°-peel strength at 25° C. between the resin layer A and the lead frame bonded to each other was measured to be 10 N/m, and no trouble of peeling occurred during conveyande. The adhesive film for semiconductor curled little, and could be handled easily when bonded. The degree of warp of the lead frame as measured after bonding as shown in FIG. 2 was about 0.1 mm.

By using the lead frame with the adhesive film for semiconductor bonded thereto, semiconductor elements were bonded to die pads. After the silver paste used for bonding was cured by heating at 150° C. for 90 minutes, the 90°-peel strength at 25° C. between the lead frame and the resin layer A was measured to be 10 N/m.

Wire-bonding was carried out on the lead frame to which semiconductor elements were bonded. After heating at 260° C. for 5 minutes in this step, the 90°-peel strength at 25° C. between the lead frame and the resin layer A was measured to be 15 N/m.

Then the lead frame was sealed in the same manner as in Example 1, to obtain a package having a structure wherein a plurality of packages each as shown in FIG. 3 were joined together. During this sealing step, there occurred no trouble of the sealing material's entering between the lead frame and the resin layer A. When peeled off from the lead frame and the sealing material at 175° C. after sealing, the adhesive film for semiconductor could be peeled off easily with a 90°-peel strength of 50 N/m.

Example 12

Figure 5:
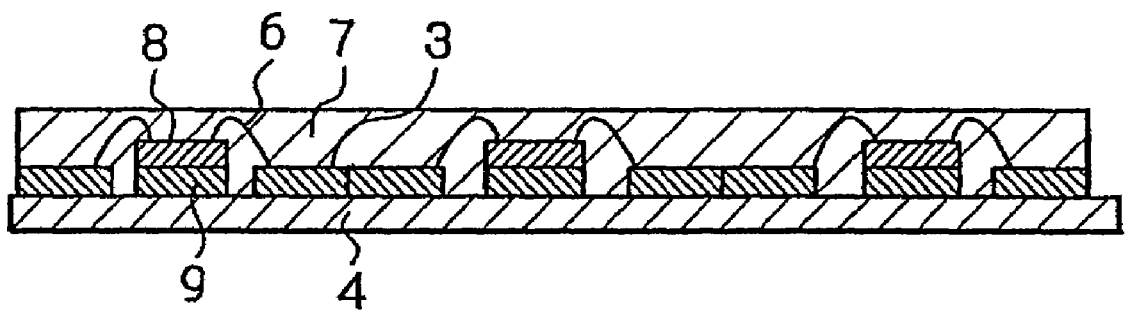
FIG. 5 is a sectional view of a semiconductor device of an embodiment according to the present invention, which bears an adhesive film for semiconductor.
Figure 6:
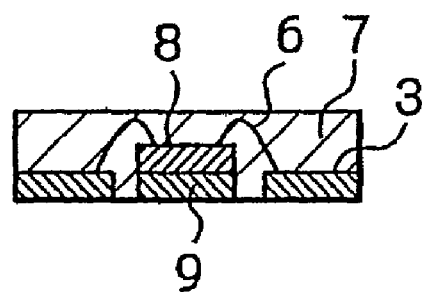
FIG. 6 is a sectional view of a semiconductor device produced by using an adhesive film for semiconductor of the present invention.

Production of an adhesive film for semiconductor, bonding it to a lead frame (a different type of lead frame), bonding semiconductor elements, wire-bonding step and sealing step were carried out in the same manner as in Example 11, to produce a package as shown in FIG. 5. No trouble occurred in any step. When peeled off from the lead frame and the sealing material at 175° C. after sealing, the adhesive film for semiconductor could be peeled off easily with a 90°-peel strength of 50 N/m, leaving very little resin residue on the lead frame and the sealing material. When the package was divided into the packages as shown in FIG. 6, no trouble occurred.

Comparative Example 1

A 125 μm thick polyimide film (produced by Ube Industries, Ltd., trade name: UPILEX SGA) having a chemically treated surface was used as a support film. The polysiloxane polyamide block copolymer adhesive varnish prepared in Preparation Example 8 was spread to 90 μm thick on one side of the support film, and dried at 100° C. for 10 minutes and at 300° C. for 10 minutes, to obtain an adhesive film for semiconductor of the structure as shown in FIG. 1, which had a support film (1) having one side coated with a 25 μm thick resin layer A (2). The resin layer A had a glass transition temperature of 182° C., a 5-wt % loss in weight temperature of 380° C. and an elastic modulus of less than 1 MPa at 230° C. The ratio of the thickness (A) of the resin layer A to the thickness (B) of the support film, (A/B), was 0.2.

The adhesive film was bonded to a palladium-coated copper lead frame at a temperature of 250° C. for 10 seconds with a pressure of 8 MPa. The 90°-peel strength at 25° C. between the resin layer A and the lead frame was measured to be 0 N/m. The lead frame was peeled off when conveyed, so the succeeding steps could not be carried out. The adhesive film for semiconductor curled little, and could be handled easily when bonded. The degree of warp of the lead frame as measured after bonding as shown in FIG. 2 was about 5 mm.

Comparative Example 2

A 125 μm thick polyimide film (produced by Ube Industries, Ltd., trade name: UPILEX SGA) having a chemically treated surface was used as a support film. A phenolic resin adhesive varnish was spread to 80 μm thick on one side of the support film, and dried at 100° C. for 10 minutes and at 150° C. for 10 minutes, to obtain an adhesive film for semiconductor of the structure as shown in FIG. 1, which had a support film (1) having one side coated with a 25 μm thick resin layer A (2). The resin layer A had a glass transition temperature of 180° C., a 5-wt % loss in weight temperature of 280° C. and an elastic modulus of 10 MPa at 230° C. The ratio of the thickness (A) of the resin layer A to the thickness (B) of the support film, (A/B), was 0.2.

The adhesive film was bonded to a palladium-coated copper lead frame at a temperature of 250° C. for 10 seconds with a pressure of 8 MPa. The 90°-peel strength at 25° C. between the resin layer A and the lead frame was measured to be 300 N/m, and no trouble of peeling occurred during conveyance. The adhesive film for semiconductor curled little, and could be handled easily when bonded. The degree of warp of the lead frame as measured after bonding as shown in FIG. 2 was about 5 mm. When bonding semiconductor elements, wire-bonding step and sealing were carried out in the same manner as in Example 1 by using the lead frame with the adhesive film for semiconductor bonded thereto to obtain a package having a structure wherein a plurality of packages each as shown in FIG. 3 were joined together, outgas was generated in wire-bonding step, contaminating wires.

When peeled off after sealing from the lead frame and the sealing material at 190° C., the 90°-peel strength was 1100 N/m, and the sealing material was partially broken. Further, a large amount of the resin adhered to the lead frame and the sealing material, and was difficult to remove by washing with N-methyl-2-pyrrolidone.

The results of Examples 1 to 12 and Comparative Examples 1 and 2 show that semiconductor packages can be produced with high working efficiency and high productivity by using an adhesive film for semiconductor, which has at 25° C. a 90-peel strength of at least 5 N/m between it and a lead frame, and can be peeled off at least at one point of temperatures ranging from 0 to 250° C. with a 90°-peel strength of at most 1000 N/m between from both of a lead frame and a sealing material.

INDUSTRIAL APPLICABILITY

The adhesive film for semiconductor of the present invention, which has high adhesion to lead frames at 25° C. but, after resin sealing, can be easily peeled off at 0 to 250° C. from lead frames and sealing resins, enabling the production of semiconductor packages with high working efficiency and high productivity.

The semiconductor device of the present invention using the adhesive film for semiconductor is excellent in capability for increasing density and decreasing area and thickness, and incorporated for example in information apparatuses, such as pocket telephones.

What is claimed is:

1. A method of producing a semiconductor device, comprising a step of bonding an adhesive film for a semiconductor to a side of a lead frame having inner leads, a step of bonding a semiconductor element to an exposed side of the lead frame, a step of connecting the semiconductor element to the inner leads, a step of sealing the exposed side of the lead frame and the semiconductor element with a sealing material, and a step of peeling off the adhesive film for a semiconductor from the lead frame and the sealing material, wherein the adhesive film comprises a support film having a thickness (B) and a resin layer having a thickness (A) and coating one or each side of the support film, and wherein the thickness (A) of the resin layer is less than 15 μm and is related to the thickness (B) of the support film by a ratio (A)/(B) of at most 0.5.

2. The method of producing a semiconductor device according to claim 1, wherein the support film has a linear thermal expansion coefficient of at most $3.0\times10^{-5}$/° C. at 20 to 200° C.

3. The method of producing a semiconductor device according to claim 1, wherein the support film has a thermal shrinkage ratio of at most 0.15% when heated to 200° C. for 2 hours.

4. The method of producing a semiconductor device according to claim 1, wherein the support film has a thickness of 5 to 50 μm.

5. The method of producing a semiconductor device according to claim 1, wherein the support film has a glass transition temperature of at least 200° C.

6. The method of producing a semiconductor device according to claim 1, wherein the support film is made of a material selected from the group consisting of aromatic polyimide, aromatic polyamide, aromatic polyamideimide, aromatic polysulfone, aromatic polyether sulfone, polyphenylene sulfide, aromatic polyether ketone, polyallylate, aromatic polyether ether ketone and polyethylene naphthalate.

7. The method of producing a semiconductor device according to claim 1, wherein the lead frame is made of a material selected from the group consisting of copper, aluminum, stainless steel and nickel.

8. The method of producing a semiconductor device according to claim 1, wherein the adhesive film, after being bonded to a lead frame, has at 25° C. a 90°-peel strength of at least 5 N/m between the resin layer and the lead frame; and, after a lead frame is bonded to the adhesive film and sealed with a sealing material, has at least at one point of temperatures ranging from 0 to 250° C. a 90°-peel strength of at most 1000 N/m between the resin layer and each of the lead frame and the sealing material.

9. The method of producing a semiconductor device according to claim 1, wherein the adhesive film has properties that it can be bonded to the backside of the lead frame to protect the backside and then can be peeled off the lead frame after bonding the semiconductor element to the lead frame and sealing them.

10. The method of producing a semiconductor device according to claim 1, wherein said resin layer has a glass transition temperature in a range of 100 to 300° C.

11. The method of producing a semiconductor device according to claim 1, wherein said resin layer has an elastic modulus of at least 1 MPa at 230° C.

12. The method of producing a semiconductor device according to claim 4, wherein the resin layer has a thickness of at least 1 μm, and up to and not including 15 μm.

13. The method of producing a semiconductor device according to claim 1, wherein the thickness of the resin layer is 10 μm or less.

* * * * *